United States Patent
Yu

(10) Patent No.: US 6,284,588 B1
(45) Date of Patent: Sep. 4, 2001

(54) METHOD FOR FABRICATING FERROELECTRIC MEMORY DEVICES CAPABLE OF PREVENTING VOLATILITY OF ELEMENTS IN FERROELECTRIC FILMS

(75) Inventor: Yong Sik Yu, Kyoungkido (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/224,200

(22) Filed: Dec. 30, 1998

(30) Foreign Application Priority Data

Dec. 30, 1997 (KR) .................................................. 97-77907

(51) Int. Cl.$^7$ .............................................. H01L 21/8242
(52) U.S. Cl. ........................... 438/240; 438/253; 438/396
(58) Field of Search ................................ 438/3, 240, 253, 438/396; 257/295, 310

(56) References Cited

U.S. PATENT DOCUMENTS

| | | | |
|---|---|---|---|
| 5,326,721 | | 7/1994 | Summerfelt ........................... 437/131 |
| 5,471,364 | * | 11/1995 | Summerfelt et al. .............. 361/321.4 |
| 5,504,330 | | 4/1996 | Summerfelt et al. .............. 250/338.3 |
| 5,548,475 | * | 8/1996 | Ushikubo et al. ................. 361/321.4 |
| 5,572,052 | * | 11/1996 | Kashihara et al. .................... 257/295 |
| 5,614,018 | * | 3/1997 | Azuma et al. ........................... 117/68 |
| 5,650,646 | * | 7/1997 | Summerfelt ........................ 257/295 |
| 5,719,417 | | 2/1998 | Roeder et al. ........................ 257/295 |
| 5,757,061 | * | 5/1998 | Satoh et al. ........................... 257/295 |
| 5,780,886 | | 7/1998 | Yamanobe ............................. 257/295 |

\* cited by examiner

Primary Examiner—Carl Whitehead, Jr.
Assistant Examiner—Toniae M. Thomas
(74) Attorney, Agent, or Firm—Blakely, Sokoloff, Taylor & Zafman

(57) ABSTRACT

The present invention relates to a highly integrated memory device; and, more particularly, to a ferroelectric capacitor memory device capable of improving an electrical interconnection between a lower electrode and an active region of a cell transistor. In accordance with an aspect of the present invention, there is provided a method for fabricating a semiconductor capacitor, comprising the steps of: forming a lower electrode of the semiconductor capacitor; forming a ferroelectric film on the lower electrode, wherein the first ferroelectric film bears a volatile element; forming a capping oxide film on the ferroelectric film; applying a rapid thermal process to the ferroelectric film and the capping oxide film; and cooling the ferroelectric film, whereby a preferred orientation of atoms in the ferroelectric film and domain boundaries thereof are perpendicular to a semiconductor substrate for which the semiconductor capacitor is provided.

9 Claims, 3 Drawing Sheets

METHOD FOR FABRICATING FERROELECTRIC MEMORY DEVICES CAPABLE OF PREVENTING VOLATILITY OF ELEMENTS IN FERROELECTRIC FILMS

FIELD OF THE INVENTION

The present invention relates to a highly integrated memory device; and, more particularly, to a ferroelectric capacitor memory device capable of preventing volatility of elements contained in a ferroelectic film.

DESCRIPTION OF THE PRIOR ART

In general, a Pt film has been widely used as a lower electrode in highly integrated DRAM cells employing high dielectric materials as well as non-volatile memory device having ferroelectric materials such as BST[Ba(Sr,Ti)$O_3$] or PZT. The ferroelectric material, such as the PZT, has a few hundreds to a few thousands of dielectric constant in two stable states in remanent polarization. Based on the remanent polarization, the thin film formed by the ferroelectric material is typically used as a capacitor in a nonvolatile memory device. In case where the ferroelecric film is employed in the nonvolatile memory device, data are input into cell capacitors by controlling the polarization direction in response to the applied electric field and such a digital signal "0" or "1" is stored by the remanent polarization which is caused by the removal of the applied electric field.

FIG. 1 is a cross-sectional view illustrating a conventional ferroelectric memory device having a Pt film as a lower electrode of a capacitor. As shown in FIG. 1, a capacitor in the conventional memory device is made up of a polysilicon plug 6, a diffusion preventing film 7 and a lower electrode 8 such as a Pt film. Since the Pt film, which is commonly used as the lower electrode 8, doesn't act as a barrier film preventing oxygen atoms from diffusing into its underlayer, the oxygen atoms are diffused into a diffusion preventing film 7 through the Pt film. In FIG. 1, unexplained reference numeral 1 denotes a semiconductor substrate, 2 a field oxide film, 3 a gate, 4 a bit line, 5 an interlayer insulating film, and 9 a ferroelectric film.

A TiN/Ti film is widely used as the diffusion preventing film 7. The barrier metal films, such as TiN and Ti films, and the polysilicon film for plug vigorously react on oxygen atoms from the dielectric film which is formed by the CVD (Chemical Vapor Deposition) method. Accordingly, the electrical interconnection between the lower electrode and an active region of the transistor is broken down. With the increase of the deposition temperature of ferroelectric materials, this problem is getting more serious.

In case of ferroelectric materials, such as BST, which is one of the prevailing materials for the ferroelectric capacitor, the temperature required in the deposition and crystallization is very high. Therefore, in order to fabricate the ferroelectric memory device on the COB (capacitor on bit line) structure, it is most important to electrically connect the Pt lower electrode to the active region of the MOSFET. As a result, other deposition methods capable of improving electric characteristics of the diffusion barrier metal are required.

In particular, it should be noted that the composition of the ferroelectic film can be changed by volatile substance as well as the out-diffusion oxygen atoms. In order to form a high quality of PZT film of the ferroelectric capacitor, the physical deposition such as a radio frequency plasma sputtering method can be used instead of the CVD. However, in any deposition method, it is difficult to control the composition of the PZT film in a subsequent thermal treatment carried out after the PZT deposition because of the volatility of Pb and the vacancy caused by the oxygen out-diffusion. These space charge defects may be moved toward grain boundaries or the domain walls, thereby generating the space charge layer which deteriorates the voluntary polarization.

SUMMARY OF THE INVENTION

It is, therefore, an object of the present invention to provide a method for fabricating a ferroelectric capacitor capable of preventing a variation and defects of PZT film in semiconductor devices.

It is another object of the present invention to provide a method for fabricating an improved PZT ferroelectric capacitor by controlling the deposition conditions of a ferroelectric material.

In accordance with an aspect of the present invention, there is provided a method for fabricating a semiconductor capacitor, comprising the steps of: forming a lower electrode of the semiconductor capacitor; forming a ferroelectric film on the lower electrode, wherein the ferroelectric film bears a volatile element; forming a capping oxide film on the ferroelectric film; applying a rapid thermal process to the ferroelectric film and the capping oxide film; and cooling the ferroelectric film, whereby a preferred orientation of atoms in the ferroelectric film and domain boundaries thereof are perpendicular to a semiconductor substrate for which the semiconductor capacitor is provided.

BRIEF DESCRIPTION OF THE DRAWINGS

The above and other and features of the present invention will become apparent from the following description of the preferred embodiments given in conjunction with the accompanying drawings, in which.

DETAILED DESCRIPTION OF THE PREFERRED EMBODIMENTS

Hereinafter, a ferroelectric capacitor of a memory device will be described referring to the accompanying drawings.

Figure 1:
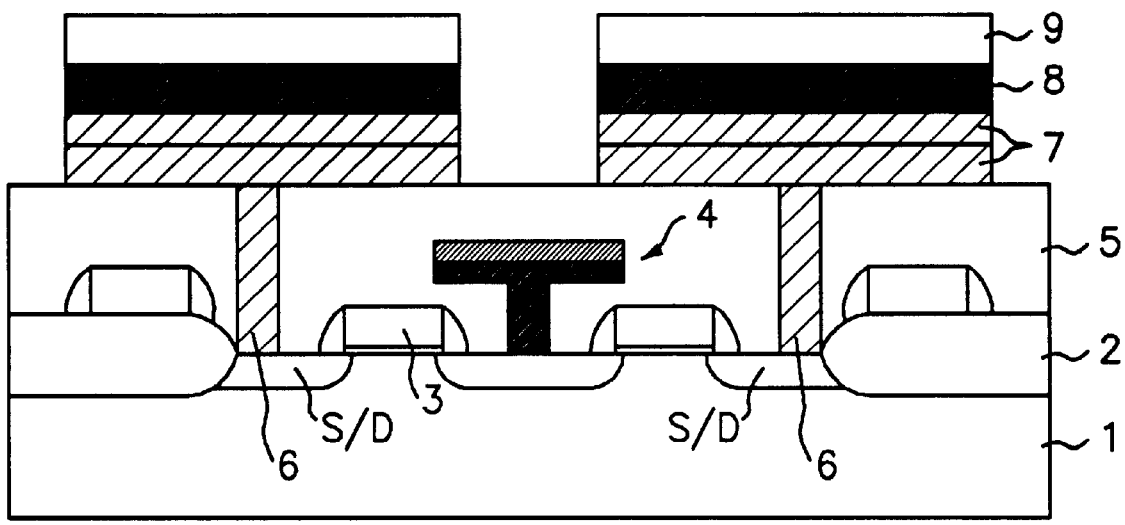
FIG. 1 is a cross-sectional view illustrating a conventional ferroelectric memory device having a Pt film as a lower electrode of a capacitor.
Figure 2A:
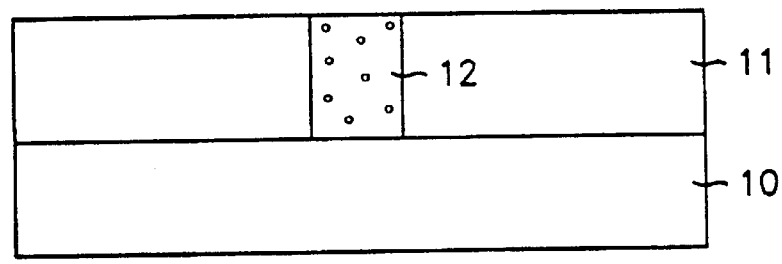
FIGS. 2A to 2F are cross-sectional views illustrating a memory device having a ferroelectric film according to the present invention.

First, referring to FIG. 2A, the ferroelectric memory device in accordance with the present invention is shown on the COB structure. As shown in FIG. 2A, the ferroelectric memory device of the present invention includes a general MOSFET (not shown), which is composed of a gate, a source and drain (S/D) formed in a semiconductor substrate 10, and a ferroelectric capacitor electrically coupled to the source and drain (S/D). Also, an insulating film 11 for planarization is coated on the resulting structure and a contact hole to expose a portion (the source and drain) of the semiconductor substrate 10 is formed. The contact hole is filled with a polysilicon film for a contact plug 12 which electrically connects the source and the drain (S/D) to a lower electrode of the semiconductor capacitor. The polysilicon film is deposited to a thickness of 500 Å to 3000 Å through the CVD method.

Figure 2B:
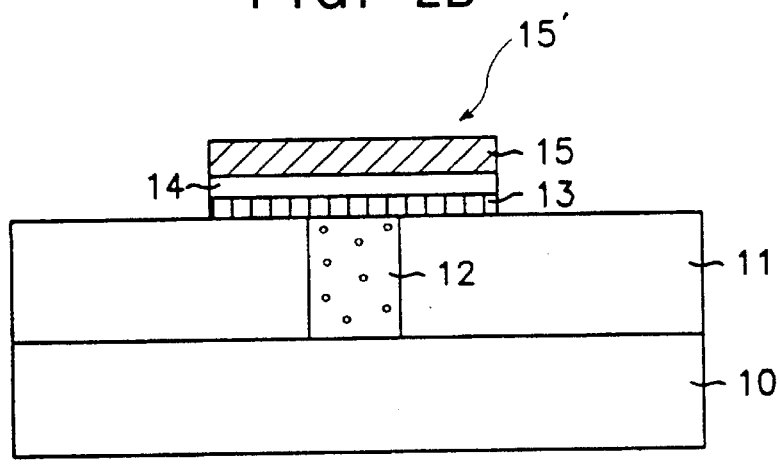

Referring to FIG. 2B, a Ti film 13 is formed on the insulating film 11 to a thickness of 100 Å to 1000 Å, being in contact with the contact plug 12. A TiN film 14 is formed on the Ti film 13 to a thickness of 200 Å to 2000 Å. After forming a diffusion barrier metal including the Ti film 13 and the TiN film 14, a lower electrode such as a Pt film 15 is formed on the TiN film 14 to a thickness of 1000 Å to 5000 Å. By patterning the Pt film 15, the TiN film 14 and the Ti film 13 in this order to a predetermined size, a lower electrode structure 15' is formed.

Figure 2C:
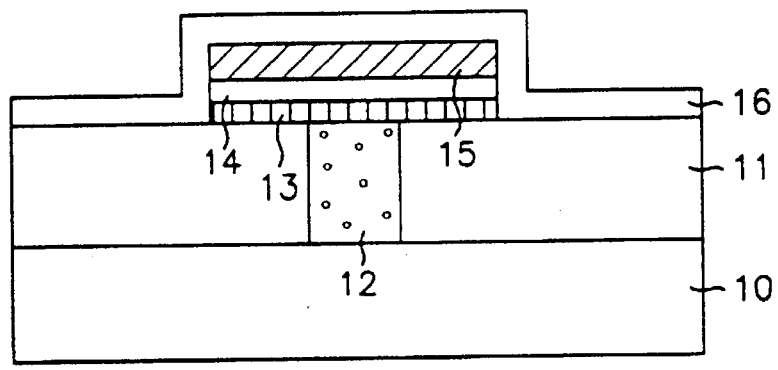

Next, referring to FIG. 2C, a PZT film 16 is formed on the insulating film 11, covering the lower electrode structure 15'. The PZT film 16 according to the present invention is formed to a thickness of 500 Å to 2000 Å using the RF plasma sputtering method which is carried out at a room temperature or below 600° C.

Figure 2D:
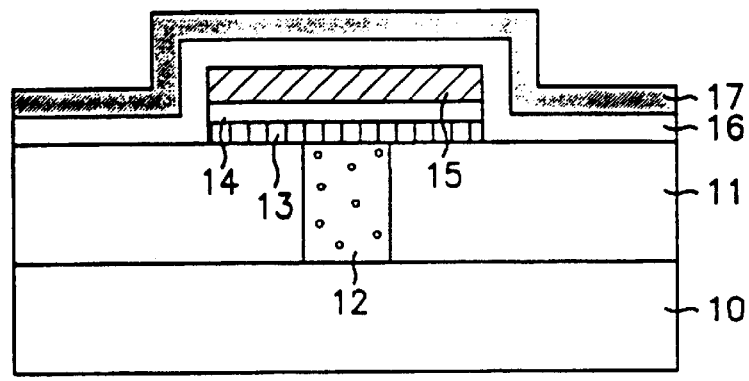

Referring to FIG. 2D, after forming the PZT film 16, a $SrTiO_3$ film 17 to be used as a capping oxide film is formed on the PZT film 16 and the rapid thermal process is carried out at a temperature of approximately 450° C. to 750° C. for 30 seconds to 120 seconds. Also, a dielectric film selected from the BST[$Ba(Sr,Ti)O_3$] materials may be substituted for the $SrTiO_3$ film 17. In the present invention, the temperature required to treat the PZT film 16 is cooled at a speed of more than −30° C. per minute to prevent the Pb from being volatilized. This cooling varies the structure of the PZT film 16 in order that the preferred orientation of the PZT film 16 and the domain boundary thereof are perpendicular to the semiconductor substrate 10 (or the deposition surface of the PZT film 16). In the present invention, the reason why the $SrTiO_3$ film 17 is employed to prevent the volatility of Pb in the PZT film 16 is that the $SrTiO_3$ film 17 provides the PZT film 16 with a structural stability. That is, the $SrTiO_3$ film 17 may block the volatility of Pb in the rapid thermal process for the crystallization of the PZT film 16.

Figure 2E:
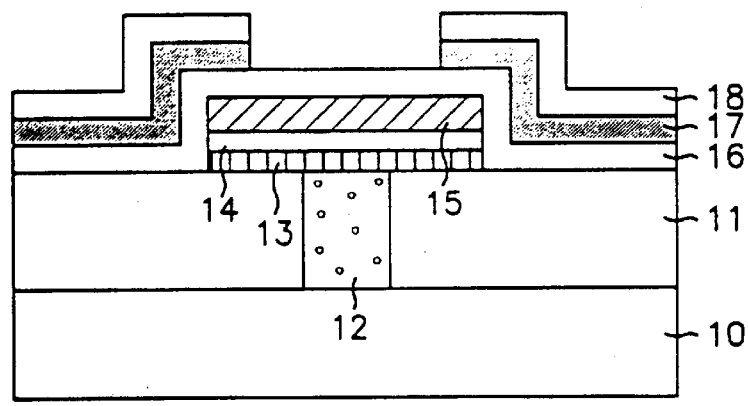

Next, referring to FIG. 2E, [a capping film such as] a silicon oxide film 18 is formed on the $SrTiO_3$ film 17 to improve the performance of blocking the volatility of Pb. A portion of the PZT film 16 is exposed by selectively etching the silicon oxide film 18 and the $SrTiO_3$ film 17 to form an upper electrode of the ferroelectric capacitor.

Figure 2F:
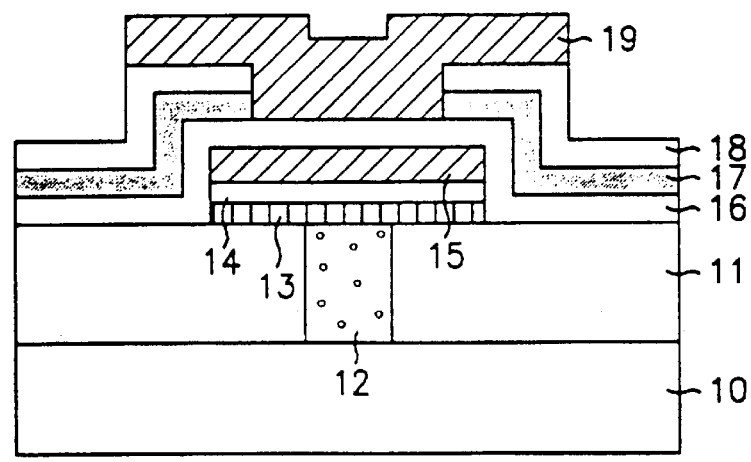

Finally, referring to FIG. 2F, the upper electrode such as a Pt film 19 is formed on the exposed PZT film 16 to a thickness of 500 Å to 2000 Å and the Pt film 19 for the upper electrode is patterned to a predetermined size.

On the other hand, in another embodiment of the present invention, the lower electrode structure 15' patterned in FIG. 2B can be formed after the formation of the PZT film 16 and the $SrTiO_3$ film 17. In other words, after forming the Ti film 13, the TiN film 14 and the Pt film 15 in this order, the lower electrode structure 15' can be obtained by patterning the $SrTiO_3$ film 17, the PZT film 16, the Pt film 15, the TiN film 14 and the Ti film 13 together.

Furthermore, a multilayer structure can be used as the lower electrode of the ferroelectric capacitor. For example, the multilayer structure capacitor can be formed as the following steps of: forming a Pt film to a thickness of 100 Å to 1000 Å; and forming a $RuO_2$ or $IrO_2$ film to a thickness of 500 Å to 5000 Å. Also, the lower electrode can be selected from metal films containing Pt, Au, Ag, Pd, Rh, Ru, Ir, Re or their metal alloy films, and further including a conducting oxide film, a conducting nitride film or a silicide film, each of which contains Ru, Ir, Re, La, Sc or Co. Likewise, the upper electrode may be selected from the above metal films.

As apparent from the above, the semiconductor capacitor according to the present invention has an effect of maintaining the remanent polarization for a long time by preventing the volatility of Pb. Also, the present invention improves the electric characteristics of the semiconductor capacitor by varying the direction of plane of polarization and the domain structure.

While the present invention has been disclosed with respect to certain preferred embodiments only, other modifications and variations may be made without departing from the spirit and scope of the present invention as set forth in the following claims.

What is claimed is:

1. A method for fabricating a semiconductor capacitor, comprising the steps of:

forming a lower electrode of the semiconductor capacitor;

forming a ferroelectric film on the lower electrode, wherein the ferroelectric bears a volatile element;

forming a BST ($Ba(Sr, Ti)O_3$) film on the ferroelectric film;

applying a rapid thermal process to the ferroelectric film and the BST ($Ba(Sr, Ti)O_3$) film; and cooling the ferroelectric film, whereby an orientation of atoms in the ferroelectric film and domain boundaries thereof are perpendicular to a semiconductor substrate for which the semiconductor capacitor is provided.

2. The method as recited in claim 1, wherein the ferroelectric film is a PZT film which is formed by a radio frequency plasma sputtering method.

3. The method as recited in claim 2, wherein the radio frequency plasma sputtering method is carried out at a room temperature or below 600° C.

4. The method as recited in claim 3, wherein the step of cooling the ferroelectric film is carried out at a speed of more than −30° C./min.

5. The method as recited in claim 1, wherein the method further comprises a step of forming a silicon oxide film on the BST ($Ba(Sr, Ti)O_3$) film.

6. The method as recited in claim 1, wherein the lower electrode is selected from metal films including Pt, Au, Ag, Pd, Rh, Ru, Ir, Re or their metal alloy films.

7. The method as recited in claim 6, wherein the lower electrode further comprises a conducting oxide film, a conducting nitride film or a silicide film, each of which contains Ru, Ir, Re, La, Sc or Co.

8. The method as recited in claim 6, wherein the lower electrode is formed to a thickness of 100 Å to 1000 Å.

9. The method as recited in claim 7, wherein the conducting oxide film, the conducting nitride film or a silicide film is formed to a thickness of 500 Å to 5000 Å.

* * * * *